United States Patent [19]

Dunn

[11] Patent Number: 4,868,415

[45] Date of Patent: Sep. 19, 1989

[54] VOLTAGE LEVEL CONVERSION CIRCUIT

[75] Inventor: William C. Dunn, Scottsdale, Ariz.

[73] Assignee: Motorola, Inc., Schaumburg, Ill.

[21] Appl. No.: 194,356

[22] Filed: May 16, 1988

[51] Int. Cl.[4] .......................... H03K 5/02; H03K 3/72

[52] U.S. Cl. .................................... 307/264; 307/475; 307/271

[58] Field of Search ............... 307/264, 268, 475, 271; 328/20

[56] References Cited

U.S. PATENT DOCUMENTS 4,061,929 12/1977 Asano .................................. 307/264

4,070,600 1/1978 Butler et al. ........................ 307/475

4,259,600 3/1981 Fellrath et al. ..................... 307/264

4,326,134 4/1982 Owen et al. ......................... 307/264

*Primary Examiner*—John Zazworsky

*Attorney, Agent, or Firm*—Mike Bingham

[57] ABSTRACT

A voltage level conversion circuit manufacturable in a standard semiconductor process is provided wherein an output voltage having a magnitude greater than the supply voltage and greater than the gate oxide breakdown voltage of the MOS devices is produced. A voltage level shifter circuit alternately charges a pair of capacitors which in turn alternately charges a second pair of capacitors. The second pair of capacitors is coupled to the output to produce the shifted output voltage having a frequency that is double the frequency of the input to the voltage level shifter circuit.

12 Claims, 2 Drawing Sheets

VOLTAGE LEVEL CONVERSION CIRCUIT

FIELD OF THE INVENTION

This invention relates in general to voltage level shifting circuits and more particularly, to a semiconductor voltage level conversion circuit for providing an output voltage that is shifted above both the level of the supply voltage and the breakdown voltage of the semiconductor circuit.

BACKGROUND OF THE INVENTION

It is common practice in semiconductor integrated circuit technology to interface different transistor technologies in electronic systems and subsystems. It is further common practice to integrate different transistor technologies on the same semiconductor chip. In order to interface the different technologies, it is often necessary to provide voltage level shifting at the interface of the different technologies for proper circuit operation. For example, when interfacing emitter coupled logic (ECL) to metal-oxide field effect transistor (MOSFET) circuits, it may be necessary to shift voltages between 1.5 volts and 15 volts.

Further challenges of interfacing different technologies are presented when it is necessary to interface low voltage circuits to high voltage circuits. A typical example includes low voltage CMOS circuits that may be used in electronic systems for their low power dissipation and high transistor density characteristics, but may be required to drive high voltage circuits as may be found in display driver and automotive applications. The high voltage circuits often have breakdown voltages that are greater than can be tolerated by the low voltage circuits.

In automotive circuits, bipolar and MOS power transistors having high voltage breakdown characteristics are used to drive solenoids and DC motors for such applications as anti-skid braking systems, electric fuel pumps, windshield wipers, power windows and locks, etc. These power transistors, however, are normally controlled and driven by low power, low voltage control circuits. Power field effect transistors such as lateral and vertical DMOS devices are especially useful for driving solenoids and DC motors since the transistors exhibit a very low on resistance and thus have a very small voltage drop across their load terminals. Such power field effect transistors then, are capable of driving solenoids and DC motors very efficiently while being able to withstand high voltages.

In order to reduce the power field effect transistor on-resistance to a minimum, it is necessary to drive the gate voltage above the supply voltage of the power devices. The battery voltage in the automobile, and hence the supply voltage of the power field effect transistor, may vary from approximately 5.5 volts up to 36 volts. Breakdown voltages of present-day power field effect transistors may exceed 80 volts. It would be desirable then, to drive the gate of the power field effect transistor to a level higher than its supply voltage but less than the breakdown voltage of the power field effect transistor. Because low voltage semiconductor circuits have excellent transistor densities and good yield, they are extremely useful as control and driving circuits for high voltage circuit applications when the high voltage interface can be bridged.

Thus, what is needed is a semiconductor voltage level conversion circuit for providing an output voltage that is shifted above both the level of the supply voltage and the breakdown voltage of the semiconductor circuit.

SUMMARY OF THE INVENTION

Accordingly, it is an object of the present invention to provide an improved semiconductor voltage level conversion circuit.

It is a further object of the present invention to provide a semiconductor voltage level conversion circuit having an output voltage whose magnitude is greater than the semiconductor breakdown voltage.

It is yet a further object of the present invention to provide a semiconductor voltage level conversion circuit wherein the frequency of the output voltage is twice the frequency of an input signal.

Still it is another object of the present invention to provide a voltage level conversion circuit having an output voltage whose magnitude is greater than the magnitude of the supply voltage.

In carrying out the above and other objects of the invention in one form, there is provided a voltage level conversion circuit manufactured in monolithic integrated circuit form, coupled between first and second supply voltage terminals for receiving first and second supply voltages, respectively, for providing an output voltage at an output terminal, wherein the magnitude of the output voltage is greater than both the first supply voltage and the breakdown voltage of the semiconductor devices.

An interface circuit is coupled to an input terminal for receiving an input signal, wherein the interface circuit shifts the voltage level of the input signal to a magnitude greater than the magnitude of the input voltage but less than the breakdown voltage of the semiconductor. A voltage conversion circuit is coupled between the interface circuit and the output terminal for providing additional level shifting of the input signal, the magnitude of the shifted signal being greater than the breakdown voltage of the semiconductor devices.

The above and other objects, features, and advantages of the present invention will be better understood from the following detailed description taken in conjunction with the accompanying drawings.

DETAILED DESCRIPTION OF THE INVENTION

Figure 1:
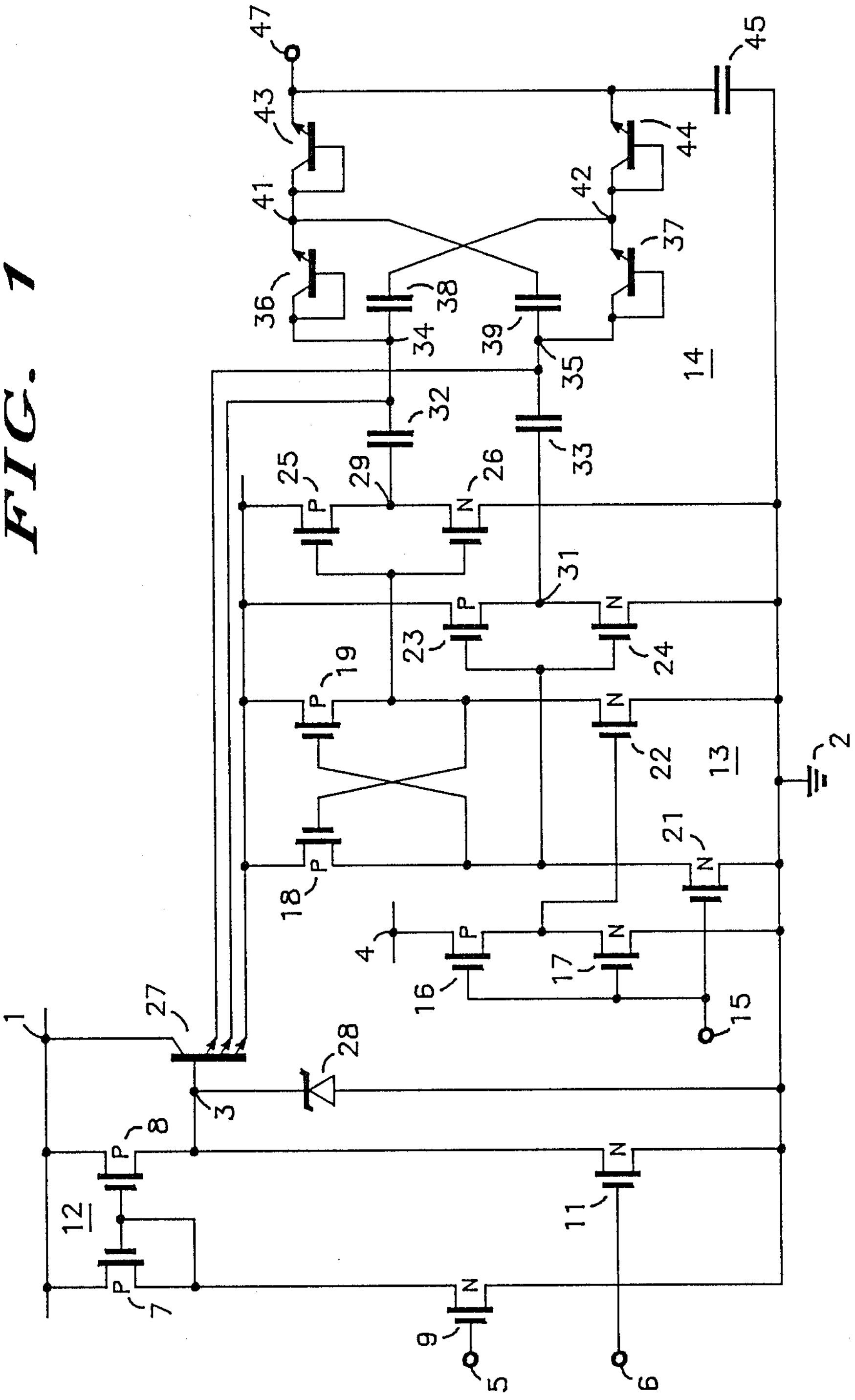
FIG. 1 is a schematic diagram of the preferred embodiment of the present invention.

FIG. 1 depicts a voltage level conversion circuit that may be fabricated in a standard semiconductor process, comprising a current mirror 12, an interface circuit 13, and a voltage conversion circuit 14. The current mirror 12 comprises field effect transistors 7 and 8 having their sources connected to a supply voltage terminal 1, and their gates connected to the drain of the field effect transistor 7. The drain of the field effect transistor 8 is connected to a voltage node 3. The field effect transistor 7 is connected to function as a diode and sets the voltage at the gate of the field effect transistor 8 so that the current flowing in the field effect transistor 7 is mirrored in the field effect transistor 8.

Field effect transistors 9 and 11 have their sources connected to a supply voltage terminal 2, their gates connected to input terminals 5 and 6, respectively, and their drains connected to the drains of the field effect transistors 7 and 8, respectively. A bias voltage applied to the input terminal 5 sets the amount of current flowing in the current mirror 12. A control signal applied to the input terminal 6 selectively turns the current mirror 12 on or off. The conversion voltage supplied at the voltage node 3 is determined by the magnitude of the battery supply voltage at the supply voltage terminal 1 and the magnitude of the current flowing in the current mirror 12.

The interface circuit 13 comprises a zener diode 28 having a cathode connected to the voltage node 3 and an anode connected to the supply voltage terminal 2. The zener diode has a zener breakdown voltage that is less than the gate oxide breakdown voltage of the field effect transistors in the voltage level conversion circuit. The gate oxide breakdown voltage in standard semiconductor processes is typically less than 25 volts. In automotive circuit applications, the battery supply voltage is supplied directly from a 12 or 24 volt lead-acid battery and can vary from 5.5 volts to 36 volts depending on environmental conditions. If the conversion voltage should exceed the zener breakdown voltage, due in part to fluctuations in the battery supply voltage, the zener diode 28 will avalanche to keep the voltage at a level below the gate oxide breakdown voltage.

A field effect transistor 16 has a source connected to a supply voltage terminal 4, a gate connected to an input terminal 15, and a drain connected to the drain of a field effect transistor 17. The field effect transistor 17 has a gate connected to the input terminal 15, and a source connected to the supply voltage terminal 2. A regulated voltage, derived from the battery supply voltage, is applied to the supply voltage terminal 4 and is typically equal to 5.0 volts. The field effect transistors 16 and 17 form an inverter whose output varies from 0.0 volts to 5.0 volts and is the complement of the oscillator input signal at the input terminal 15.

A bipolar transistor 27 has a collector connected to the supply voltage terminal 1 and a base connected to the voltage node 3. Field effect transistors 18 and 19 have their sources connected to a first emitter of the bipolar transistor 27, and their drains connected to the drains of field effect transistors 21 and 22 respectively. The gate of the field effect transistor 18 is connected to the drain of the field effect transistor 19, and the gate of the field effect transistor 19 is connected to the drain of the field effect transistor 18. The field effect transistor 21 has a gate connected to the input terminal 15 and a source connected to the supply voltage terminal 2. The field effect transistor 22 has a gate connected to the drain of the field effect transistor 16, and a source connected to the supply voltage terminal 2. The field effect transistors 18, 19, 21, and 22 provide a shifted and a complemented shifted voltage signal of the oscillator input signal at the drains of the field effect transistors 19 and 18 respectively. The magnitude of the shifted and complemented shifted voltages vary from the conversion voltage less a base-emitter voltage ($V_{be}$) to the ground supply voltage potential at the supply voltage terminal 2.

The sources of field effect transistors 23 and 25 are connected to the first emitter of the bipolar transistor 27, the gates are connected to the gates of field effect transistors 24 and 26, respectively, and the drains are connected to the nodes 31 and 29, respectively. The field effect transistors 24 and 26 have their sources connected to the supply voltage terminal 2, and their gates connected to the drains of the field effect transistors 18 and 19, respectively, and the drains are connected to the nodes 31 and 29 respectively. The field effect transistors 23 and 24, and 25 and 26 form two inverters to provide additional current drive and wave-shaping of the shifted and the complemented shifted signals.

The interface circuit 13 functionally converts an input signal that varies from 0.0 volts to 5.0 volts and provides true and complemented output voltages that vary from 0.0 volts to the conversion voltage less a $V_{be}$. And the conversion voltage is limited to the zener breakdown voltage which is selected to be less than the gate oxide breakdown voltage. Further, the interface circuit 13 is coupled to a battery supply voltage that may exceed the gate oxide breakdown voltage of the field effect transistors contained therein without subjecting the gate oxide of the field effect transistors to the full potential of the battery supply voltage.

A voltage conversion circuit 14 comprises a capacitor 32 coupled between the node 29 and a node 34, and a capacitor 33 coupled between the node 31 and a node 35. The nodes 34 and 35 are connected to a second and third emitter, respectively, of the bipolar transistor 27. A capacitor 38 is coupled between the node 34 and a node 42, and a capacitor 39 is coupled between the node 35 and a node 41. A bipolar transistor 36 is connected as a diode having a base and a collector connected to the node 34 and an emitter connected to the node 41. A bipolar transistor 37 is connected as a diode having a base and a collector connected to the node 35 and an emitter connected to the node 42. Bipolar transistors 43 and 44 are connected as diodes having the emitters connected to an output terminal 47. The bipolar transistor 43 has a base and a collector connected to the node 41, and the bipolar transistor 47 has a base and a collector connected to the node 42. A capacitor 45 is coupled between the output terminal 47 and the supply voltage terminal 2.

Figure 2:
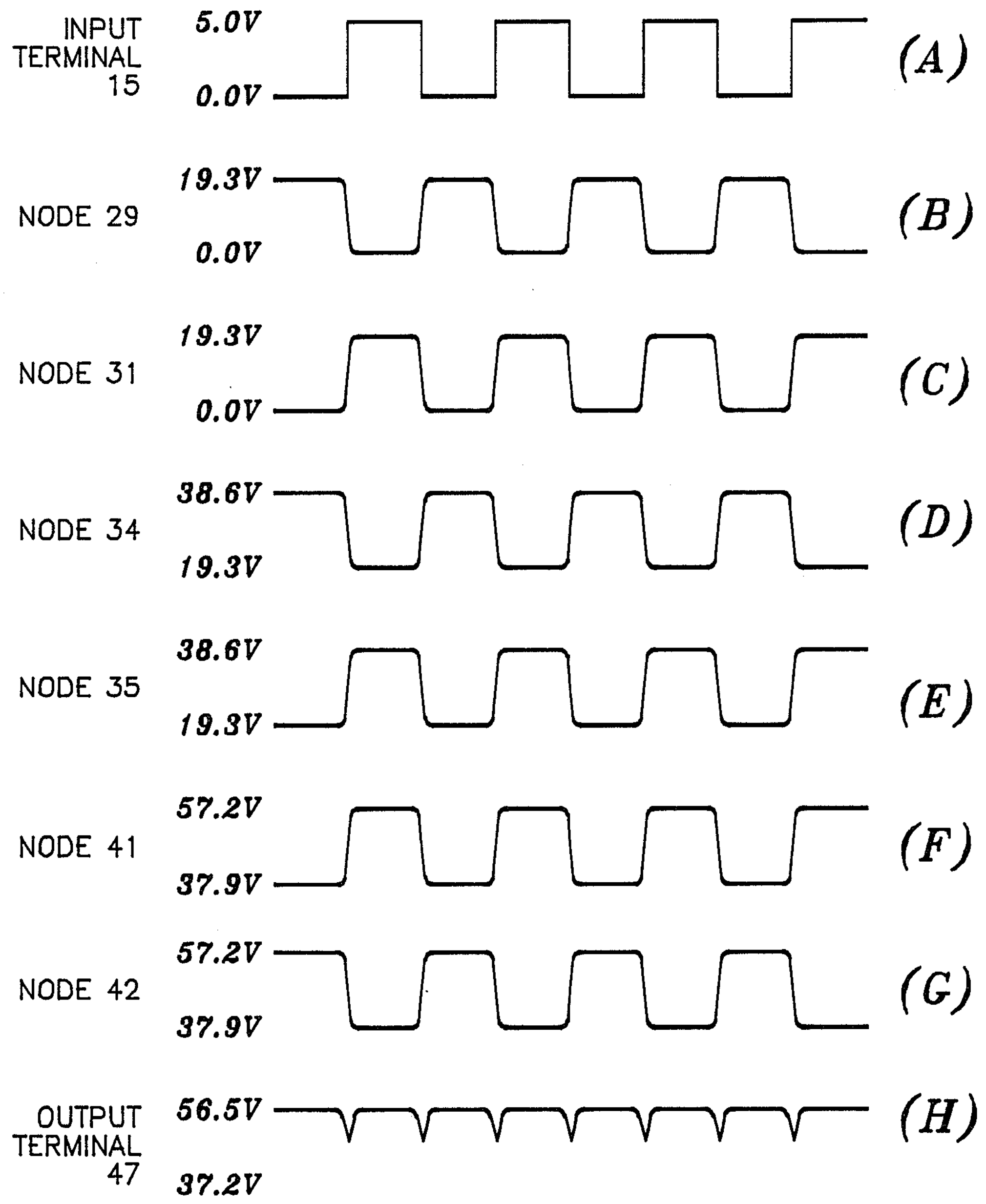
FIG. 2 is a waveform diagram of selected signals in the preferred embodiment.

The following discussion of the circuit operation assumes a battery supply voltage of 36 volts, a base-emitter voltage of 0.7 volts, an input signal that varies from 0.0 volts to 5.0 volts, and a zener breakdown voltage of 20.0 volts. These voltage levels are used for purposes of example only; the actual voltages may vary substantially under normal circuit operation. FIG. 2 illustrates the voltage waveforms that would be expected at the specified nodes in the voltage level conversion circuit.

The current mirror 12 provides a conversion voltage at the voltage node 3 which is a function of the bias voltage and the battery supply voltage, and further supplies a base current to the bipolar transistor 27. With a battery supply voltage of 36.0 volts, the conversion voltage will try to rise above the zener breakdown voltage of the zener diode 28, causing it to avalanche therein limiting the conversion voltage to 20.0 volts. As the battery voltage falls, for example to 6.0 volts (as could occur when starting an automobile in freezing weather), the conversion voltage will drop proportionally and the zener diode 28 will not be caused to avalanche to limit the conversion voltage.

The voltage at the first emitter of the bipolar transistor 27 will equal the conversion voltage less a $V_{be}$, and is limited to 19.3 volts since the conversion voltage is limited to 20.0 volts. Referring to FIG. 2, the oscillator input signal is shown as a square wave at input terminal 15 which results in the waveforms shown at the nodes 29 and 31 The signal at the node 29 is inverted and has a magnitude that equals the conversion voltage less a $V_{be}$, and the signal at the node 31 is non-inverted with the same magnitude. When the voltage at node 29 is at 0.0 volts, the voltage at the node 34 will equal the emitter voltage of the second emitter of the bipolar transistor 27 which is also equal to the conversion voltage less a $V_{be}$ or 19.3 volts. Similarly, when the voltage at node 31 is at 0.0 volts, the voltage at the node 35 will equal the emitter voltage of the third emitter of the bipolar transistor 27 which is also equal to the conversion voltage less a $V_{be}$ or 19.3 volts.

As the voltage at the node 29 rises from 0.0 volts to 19.3 volts, the voltage at the node 34 will charge through the capacitor 32 to 38.6 volts or an additional 19.3 volts. As the voltage at the node 34 increases a $V_{be}$ above the conversion voltage, the second emitter becomes reverse biased and isolates the node 34 from the voltage node 3. When the voltage at the node 29 falls towards 0.0 volts, the voltage at the node 34 discharges towards 0.0 volts through the capacitor 32. However, as the node 34 falls a $V_{be}$ below the conversion voltage, the second emitter becomes forward biased to keep the node 34 charged to 19.3 volts. The voltage at the nodes 31 and 35 charges and discharges through the capacitor 33 in the same manner as the nodes 29 and 34, respectively. The third emitter of the bipolar transistor 27 operates analogously to the second emitter. The voltages at the nodes 34 and 35 are 180 degrees out of phase as shown in FIG. 2.

The voltage at the node 41 is equal to the voltage at the node 34 less a $V_{be}$ when the voltage at the node 35 is at a minimum. As the voltage at the node 35 increases from 19.3 volts to 38.6 volts, it charges through the capacitor 39 to increase the voltage at the node 41 by the same amount. When the voltage at the node 41 increase to a $V_{be}$ above the voltage at the node 34, the diode action of the bipolar transistor 36 isolates the node 34 from the node 41. And when the voltage at the node 35 decreases from 38.6 volts to 19.3 volts, the voltage at the node 41 will start to decrease from 57.2 volts towards 19.3 volts. However, as the voltage at the node 41 falls a $V_{be}$ below the voltage at the node 34, the bipolar transistor 36 becomes forward biased to keep the node 41 charged to a voltage that is a $V_{be}$ below the voltage at the node 34 or 37.9 volts. The voltage at the node 42 charges and discharges in an analogous manner as that of the node 41, but through the bipolar transistor 37 and the capacitor 38 and 180 degrees out of phase as shown in FIG. 2.

The output voltage at the output terminal 47 is the result of the alternating peak values of the voltages at the nodes 41 and 42. When the voltage at the node 41 is at its maximum of 57.2 volts, the voltage at the node 42 will be at its minimum of 37.9 volts. This causes the output voltage to equal the voltage at the node 41 less a $V_{be}$ or 56.5 volts which further causes the bipolar transistor 44 to act as a reverse biased diode therein isolating the output terminal 47 from the node 42. Alternately, when the voltage at the node 42 is at its maximum of 57.2 volts, the voltage at the node 41 will be at its minimum of 37.9 volts. This causes the output voltage to equal the voltage at the node 42 less a $V_{be}$ or 56.5 volts which further causes the bipolar transistor 43 to act as a reverse biased diode therein isolating the output terminal 47 from the node 41.

The maximum magnitude of the output voltage can be calculated by:

$$V_{out}=3(V_{conv}1)-5(V_{be})$$

where $V_{conv}$ is the conversion voltage, and $V_{out}$ is the output voltage. Also the frequency of the output voltage is equal to two times the frequency of the input signal. A result and advantage of the frequency doubling is a decrease in the impedance at the output terminal 47. A magnitude of 56.5 volts at the output terminal may be safely provided without causing gate oxide damage to the MOS devices. The potential that appears across the capacitors 32, 33, 38, and 39 never exceeds the conversion voltage. This allows the capacitors 32, 33, 38, and 39 to be fabricated by using polysilicon over thin oxide (gate oxide) without exceeding the gate oxide breakdown voltage. The advantage of this is the capability of making capacitors having a higher capacitance per unit area, and thus less silicon area per capacitor.

The output voltage has a high enough magnitude that it can be used to overdrive the gate of a power field effect transistor. In the automobile application, a power field effect transistor would be coupled directly to the battery supply voltage. Should the battery supply voltage reach 36 volts, the voltage level conversion circuit provides an output voltage of 56.5 volts which is sufficient to operate the power field effect transistor in its most efficient operating region (minimum channel resistance).

By now it should be appreciated that there has been provided a semiconductor voltage level conversion circuit for providing an output voltage that is shifted above both the level of the supply voltage and the breakdown voltage of the semiconductor circuit.

I claim:

1. A voltage level conversion circuit manufactured with a semiconductor process having a breakdown voltage, said circuit comprising;

a first supply voltage terminal for receiving a first voltage;

a second supply voltage terminal for receiving a second voltage;

a third supply voltage terminal for receiving a third voltage;

a fourth supply voltage terminal for receiving a fourth voltage;

an input terminal for receiving an input signal;

an output terminal;

level shifting means coupled to said first supply voltage terminal for providing a plurality of level shifted voltages with respect to the first voltage at a plurality of respective output nodes;

a first field effect transistor having a source coupled to said third supply voltage terminal, a gate coupled to said input terminal, and having a drain;

a second field effect transistor having a source coupled to said second supply voltage terminal, a gate coupled to said input terminal, and a drain coupled to the drain of said first field effect transistor;

a third field effect transistor having a source coupled to a first output node of said level shifting means, and having a gate and a drain;

a fourth field effect transistor having a source coupled to said second supply voltage terminal, a drain coupled to the drain of said third field effect transistor, and a gate coupled to said input terminal;

a fifth field effect transistor having a source coupled to the first output node of said level shifting means, a gate coupled to the drain of said third field effect transistor, and a drain coupled to the gate of said third field effect transistor;

a sixth field effect transistor having a source coupled to said second supply voltage terminal, a gate coupled to the drain of said first field effect transistor, and a drain coupled to the drain of said fifth field effect transistor a seventh field effect transistor having a source coupled to the first output node of said level shifting mean, a gate coupled to the drain of said fifth field effect transistor, and a drain coupled to a first node;

an eighth field effect transistor having a source coupled to said second supply voltage terminal, a gate coupled to the gate of said seventh field effect transistor, and a drain coupled to the first node;

a ninth field effect transistor having a source coupled to the first output node of said level shifting means, a gate coupled to the drain of said third field effect transistor, and a drain coupled to a second node;

a tenth field effect transistor having a source coupled said second supply voltage terminal, a gate coupled to the gate of said ninth field effect transistor, and a drain coupled to the second node;

first means coupled to the first and second nodes for providing a shifted true and a shifted complemented signal wherein the magnitude of the voltage levels of the shifted true and shifted complemented signals is greater than the breakdown voltage; and second means coupled between said first means and said output terminal for providing the output voltage having a frequency equal to two times the frequency of the input signal.

2. A voltage level conversion circuit according to claim 1 wherein said first means comprises:

a first capacitor having a first terminal coupled to the first node and having a second terminal coupled to a second output node of said level shifting means;

a second capacitor having a first terminal coupled to the second node and having a second terminal coupled to a third output node of said level shifting means;

a third capacitor having a first terminal coupled to the second terminal of said first capacitor and having a second terminal;

a fourth capacitor having a first terminal coupled to the second terminal of said second capacitor and having a second terminal;

a first diode having an anode coupled to the first terminal of said third capacitor and a cathode coupled to the second terminal of said fourth capacitor; and a second diode having an anode coupled to the first terminal of said fourth capacitor and a cathode coupled to the second terminal of said third capacitor.

3. A voltage level conversion circuit according to claim 2 wherein said second means comprises:

a third diode having an anode coupled to the cathode of said first diode and a cathode coupled to said output terminal;

a fourth diode having an anode coupled to the cathode of said second diode and a cathode coupled to said output terminal; and a fifth capacitor having a first terminal coupled to the output terminal and a second terminal coupled to said second supply voltage terminal.

4. A voltage level conversion circuit according to claim 2 wherein said level shifting means comprises a bipolar transistor having a collector coupled to said fourth supply voltage terminal, a base coupled to said first supply voltage terminal, and a first emitter coupled to the source of said third field effect transistor, a second emitter coupled to the second terminal of said first capacitor, and a third emitter coupled to the second terminal of said second capacitor.

5. A voltage level conversion circuit according to claim 4, further comprising a third means coupled between said first supply voltage terminal and said second supply voltage terminal for limiting the first voltage to a magnitude less than the breakdown voltage.

6. A voltage level conversion circuit according to claim 5 wherein said third means comprises a zener diode having a cathode coupled to said first supply voltage terminal and an anode coupled to said second supply voltage terminal.

7. A voltage level conversion circuit according to claim 4 further comprising a fourth means coupled between said fourth supply voltage terminal and said first supply voltage terminal for selectively providing the first voltage to said first supply voltage terminal.

8. A voltage level conversion circuit according to claim 7 wherein said a fourth means comprises:

a bias voltage terminal for receiving a bias voltage;

a control terminal for receiving a control signal;

an eleventh field effect transistor having a source coupled to said fourth supply voltage terminal and having a gate coupled to a drain;

a twelfth field effect transistor having a drain coupled to the drain of said eleventh field effect transistor, a gate coupled to said bias voltage terminal, and a source coupled to said second supply voltage terminal;

a thirteenth field effect transistor having a source coupled to said fourth supply voltage terminal, a gate coupled to the gate of said eleventh field effect transistor, and a drain coupled to said first supply voltage terminal; and a fourteenth field effect transistor having a drain coupled to said first supply voltage terminal, a gate coupled to said control terminal, and a source coupled to said second supply voltage terminal.

9. A voltage level conversion circuit manufactured with a semiconductor process having a breakdown voltage, said circuit comprising;

a first supply voltage terminal for receiving a first voltage;

a second supply voltage for receiving a second voltage;

a third supply voltage terminal for receiving a third voltage;

an input terminal for receiving an input signal;

an output terminal;

first means coupled between said first and second supply voltage terminals and coupled to said input terminal for providing shifted true and complemented signals of the input signal at first and second nodes, respectively;

a first capacitor having a first terminal coupled to the first node and having a second terminal;

a second capacitor having a first terminal coupled to the second node and having a second terminal;

a third capacitor having a first terminal coupled to the second terminal of said first capacitor and having a second terminal;

a fourth capacitor having a first terminal coupled to the second terminal of said second capacitor and having a second terminal;

a fifth capacitor having a first terminal coupled to said output terminal and a second terminal coupled to said second supply voltage terminal;

a bipolar transistor having a collector coupled to said third supply voltage terminal, a base coupled to said first supply voltage terminal, a first emitter coupled to the second terminal of said first capacitor, and a second emitter coupled to the second terminal of said second capacitor;

a first diode having an anode coupled to the first terminal of said third capacitor and a cathode coupled to the second terminal of said fourth capacitor;

a second diode having an anode coupled to the first terminal of said fourth capacitor and a cathode coupled to the second terminal of said third capacitor;

a third diode having an anode coupled to the cathode of said first diode and a cathode coupled to said output terminal; and a fourth diode having an anode coupled to the cathode of said second diode and a cathode coupled to said output terminal.

10. A voltage level conversion circuit according to claim 9 further comprising:

a bias voltage terminal for receiving a bias voltage;

a control terminal for receiving a control signal;

an first field effect transistor having a source coupled to said third supply voltage terminal and having a gate coupled to a drain;

a second field effect transistor having a drain coupled to the drain of said first field effect transistor, a gate coupled to said bias voltage terminal, and a source coupled to said second supply voltage terminal;

a third field effect transistor having a source coupled to said third supply voltage terminal, a gate coupled to the gate of said first field effect transistor, and a drain coupled to said first supply voltage terminal; and a fourth field effect transistor having a drain coupled to said first supply voltage terminal, a gate coupled to said control terminal, and a source coupled to said second supply voltage terminal.

11. A voltage level conversion circuit according to claim 9 further comprising a zener diode having a cathode coupled to said first supply voltage terminal and an anode coupled to said second supply voltage terminal.

12. A voltage level conversion circuit manufactured with a semiconductor process having a breakdown voltage, said circuit comprising:

a first supply voltage terminal for receiving a first voltage;

a second supply voltage terminal for receiving a second voltage;

an input terminal for receiving an input signal;

an output terminal;

first means coupled between said first and second supply voltage terminals and coupled to said input terminal for providing a true and a complemented signal having a voltage levels greater than the magnitude of the input signal, but less than the breakdown voltage;

second means coupled between said first and second supply voltage terminals and coupled to said first means for increasing the current drive of the true and complemented signals;

third means coupled to said second means for providing a shifted true and a shifted complemented signal wherein the magnitude of the voltage levels of the shifted true and shifted complemented signals is greater than the breakdown voltage; and fourth means coupled between said third means and said output terminal for providing the output voltage having a frequency equal to two times the frequency of the input signal.

* * * * *

UNITED STATES PATENT AND TRADEMARK OFFICE
CERTIFICATE OF CORRECTION

PATENT NO. : 4,868,415

DATED : September 19, 1989

INVENTOR(S) : William Dunn

It is certified that error appears in the above-identified patent and that said Letters Patent is hereby corrected as shown below:

Column 8, claim 9, line 51, insert "terminal" after voltage.

Signed and Sealed this

Twenty-eighth Day of May, 1991

*Attest:*

HARRY F. MANBECK, JR.

*Attesting Officer*

*Commissioner of Patents and Trademarks*